(12) United States Patent
Wang et al.

(10) Patent No.: US 8,878,182 B2
(45) Date of Patent: Nov. 4, 2014

(54) PROBE PAD DESIGN FOR 3DIC PACKAGE YIELD ANALYSIS (75) Inventors: Tzu-Yu Wang, Taipei (TW); Chen-Hua Yu, Hsin-Chu (TW); Shin-Puu Jeng, Hsin-Chu (TW); Shang-Yun Hou, Jubei (TW); Hsien-Pin Hu, Zhubei (TW); Wei-Cheng Wu, Hsin-Chu (TW); Li-Han Hsu, Hsin-Chu (TW); Meng-Han Lee, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 121 days.

(21) Appl. No.: 13/272,004

(22) Filed: Oct. 12, 2011

(65) Prior Publication Data
US 2013/0092935 A1 Apr. 18, 2013

(51) Int. Cl.
H01L 23/58 (2006.01)
H01L 21/66 (2006.01)
H01L 23/498 (2006.01)
H01L 23/538 (2006.01)
H01L 23/00 (2006.01)
H01L 25/065 (2006.01)
H01L 23/31 (2006.01)

(52) U.S. Cl.
CPC .......... *H01L 22/32* (2013.01); *H01L 23/49833* (2013.01); H01L 2924/15192 (2013.01); H01L 2224/13147 (2013.01); *H01L 23/49822* (2013.01); H01L 24/73 (2013.01); H01L 24/32 (2013.01); H01L 2224/131 (2013.01); H01L 25/0655 (2013.01); *H01L 23/49827* (2013.01); H01L 23/3128 (2013.01); H01L 2224/32225 (2013.01); H01L 2224/16225 (2013.01); H01L 2224/73204 (2013.01); H01L 24/16 (2013.01); *H01L 23/5384* (2013.01); *H01L 24/13* (2013.01); *H01L 2924/15311* (2013.01)
USPC ................ 257/48; 257/E21.521; 257/E23.01; 438/17

(58) Field of Classification Search
None
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |

(Continued)

Primary Examiner — Michael Lebentritt
Assistant Examiner — Kevin Quinto
(74) Attorney, Agent, or Firm — Slater & Matsil, L.L.P.

(57) ABSTRACT

An interposer includes a first surface on a first side of the interposer and a second surface on a second side of the interposer, wherein the first and the second sides are opposite sides. A first probe pad is disposed at the first surface. An electrical connector is disposed at the first surface, wherein the electrical connector is configured to be used for bonding. A through-via is disposed in the interposer. Front-side connections are disposed on the first side of the interposer, wherein the front-side connections electrically couple the through-via to the probe pad.

18 Claims, 10 Drawing Sheets

(56) References Cited

U.S. PATENT DOCUMENTS

| | | | |
|---|---|---|---|
| 6,562,653 | B1 | 5/2003 | Ma et al. |
| 6,570,248 | B1 | 5/2003 | Ahn et al. |
| 6,600,222 | B1 | 7/2003 | Levardo |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,790,748 | B2 | 9/2004 | Kim et al. |
| 6,887,769 | B2 | 5/2005 | Kellar et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,151,009 | B2 | 12/2006 | Kim et al. |
| 7,157,787 | B2 | 1/2007 | Kim et al. |
| 7,215,033 | B2 | 5/2007 | Lee et al. |
| 7,276,799 | B2 | 10/2007 | Lee et al. |
| 7,279,795 | B2 | 10/2007 | Periaman et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,345,350 | B2 | 3/2008 | Sinha |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,576,435 | B2 | 8/2009 | Chao |
| 7,834,450 | B2 | 11/2010 | Kang |
| 2002/0047200 | A1* | 4/2002 | Bai ................................ 257/738 |
| 2003/0219966 | A1 | 11/2003 | Jin et al. |
| 2004/0007778 | A1 | 1/2004 | Shinozaki et al. |
| 2004/0126927 | A1 | 7/2004 | Lin et al. |
| 2006/0267615 | A1* | 11/2006 | Grilletto et al. ............... 324/763 |
| 2008/0185716 | A1 | 8/2008 | Huang |
| 2009/0149016 | A1 | 6/2009 | Park et al. |
| 2009/0197114 | A1 | 8/2009 | Shih et al. |
| 2011/0193218 | A1 | 8/2011 | Arvin et al. |
| 2011/0304042 | A1 | 12/2011 | Lin et al. |

* cited by examiner

PROBE PAD DESIGN FOR 3DIC PACKAGE YIELD ANALYSIS

BACKGROUND

In the packaging of integrated circuits, a plurality of package components may be bundled in a same package. The package components may include device dies, interposers, package substrates, printed circuit boards (PCBs), and the like. These package components may be packaged in different combinations.

Typically, before the packaging process is performed, the device wafers are tested (probed), so that known-good-dies can be selected and packaged, while failed dies are not packaged. After the packaging is finished, the resulting packages are also probed so that the failed packages may be found. The failure of the packages may be caused by defective joints, damages occurring in the packaging processes, and the problems introduced by interposers, package substrates, and PCBs. However, the existing package structures only provide means for probing the final packages, while during the intermediate stages in the packaging processes, the probing may not be performed. This may incur extra cost and longer cycle time for production since the failed packages cannot be identified in early packaging stages. In addition, when the failed packages are found, it is difficult to isolate the exact locations of the problems, and hence it is difficult to use the probing results to guide the future manufacturing process.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

An interposer and the method of performing yield analysis on packages are provided in accordance with various embodiments. The variations and the operation of the embodiments are discussed. Throughout the various views and illustrative embodiments, like reference numbers are used to designate like elements.

Figure 1:
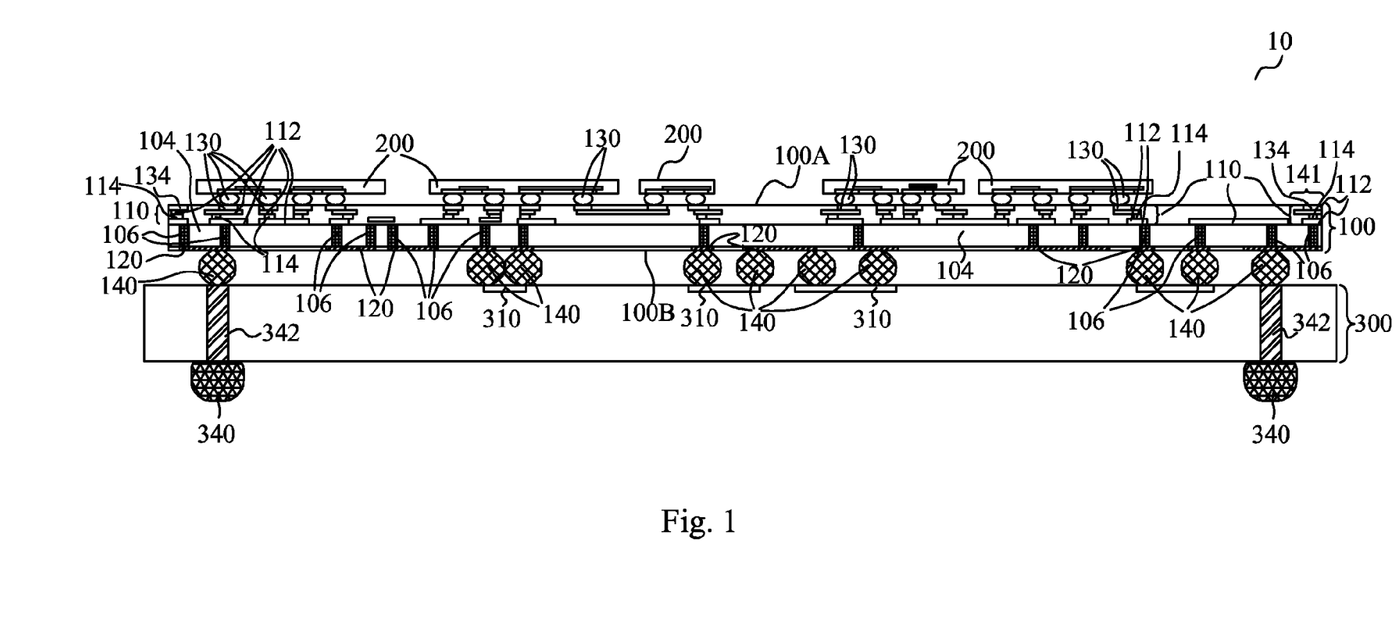
FIGS. 1 and 2 are cross-sectional views of intermediate stages in the manufacturing of a package in accordance with various embodiments.

FIG. 1 illustrates exemplary package 10 in accordance with various embodiments. Package 10 includes interposer 100, which is configured to make electrical connections from major surface 100A (also referred to as a first surface or a front surface hereinafter) to major surface 100B (also referred to as a second surface or a back surface hereinafter). Major surfaces 100A and 100B are opposite surfaces of interposer 100. In an embodiment, interposer 100 includes substrate 104, which may be formed of a semiconductor material such as silicon, although other semiconductor materials or dielectric materials may also be used. In an embodiment, interposer 100 is free from active devices such as transistors and passive devices such as resistors, capacitors, inductors, and the like. In alternative embodiments, interposer 100 may be a passive interposer with no active devices (such as transistors) formed therein, but include passive devices therein.

Through-vias 106 (alternatively referred to as through-substrate vias 106) are formed in substrate 104, and penetrate through substrate 104. Electrical connections, which include metal lines and vias, may be formed on one side or both sides of substrate 104, and electrically coupled to through-vias 106. The electrical connections include front-side connections 110, which include a plurality metal lines 112 and vias 114. Furthermore, backside connections 120 may be formed on the back side of substrate 104. Although FIG. 1 illustrates one backside metal layer, interposer 100 may also include a plurality of metal layers on the backside, similar to front-side connections 110. Front-side connections 110 are electrically coupled to backside connections 120 through through-vias 106.

Figure 3:
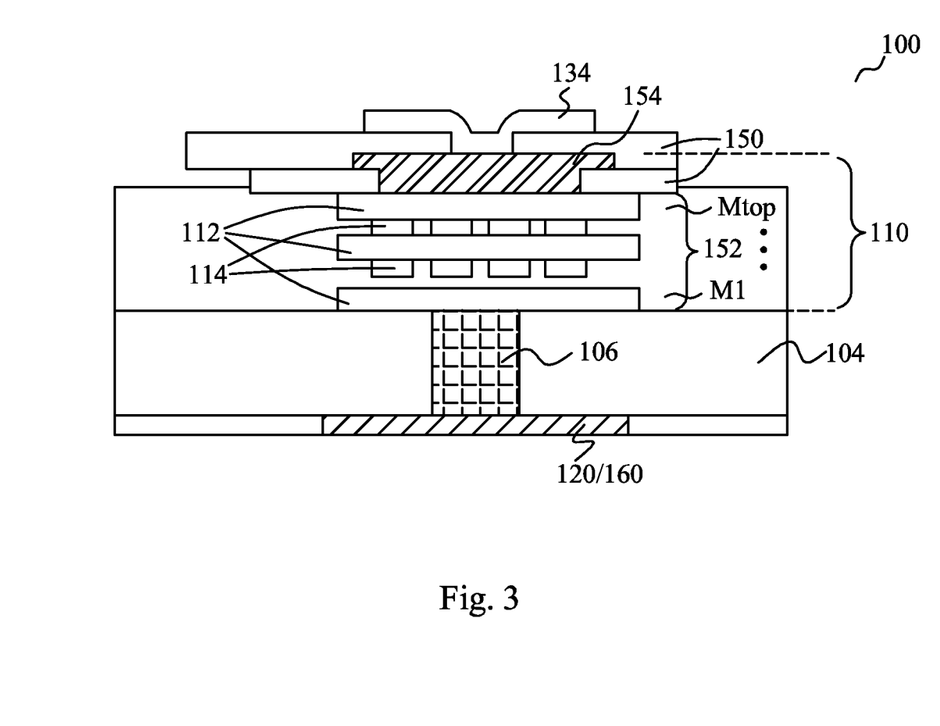
FIG. 3 illustrates a magnified view of a portion of an interposer shown in FIGS. 1 and 2.

Interposer 100 includes electrical connectors 130 that are used for bonding to, and electrically coupling to, package components 200 that on the front side of interposer 100. In an embodiment, package components 200 include device dies, which may include active devices such as transistors (not shown) therein. Electrical connectors 130 may include solder bumps, solder balls, copper pillars, or the like, and may also include under-bump-metallurgies (UBMs). The exemplary UBMs are shown in FIG. 3. Some of electrical connectors 130 may be electrically coupled to probe pads 134, which are formed on the front side of interposer 100. Furthermore, probe pads 134 may be electrically coupled to backside connections 120 through through-vias 106. The detailed exemplary connections between probe pads 134 and electrical connectors 130 as well as backside connections 120 are shown in FIGS. 4 through 10.

The bonding scheme for bonding package components 200 to the front side of interposer 100 may include flip chip bonding, for example. Package components 200 may include active devices such as transistors (not shown) therein. On the backside of interposer 100, package component 300 is bonded to interposer 100. In an exemplary embodiment, package component 300 is a package substrate, which may be a laminate substrate. Accordingly, throughout the description, package component 300 may be referred to as package substrate 300, although it may also be one of other types of package components such as a printed circuit board (PCB), a device die, a package, or the like. The bonding between interposer 100 and package substrate 300 may be achieved through electrical connectors 140. In an embodiment, electrical connectors 140 include solder balls (sometimes referred to as C4 bumps), although other types of connector structures such as copper pillars may also be included. Package substrate 300 may further include through-connections 342 that electrically couple electrical connectors 140 to electrical connectors 340, wherein electrical connectors 140 and electrical connectors 340 are on opposite sides of package substrate 300. Connections 342 may include metal lines and vias.

Figure 2:
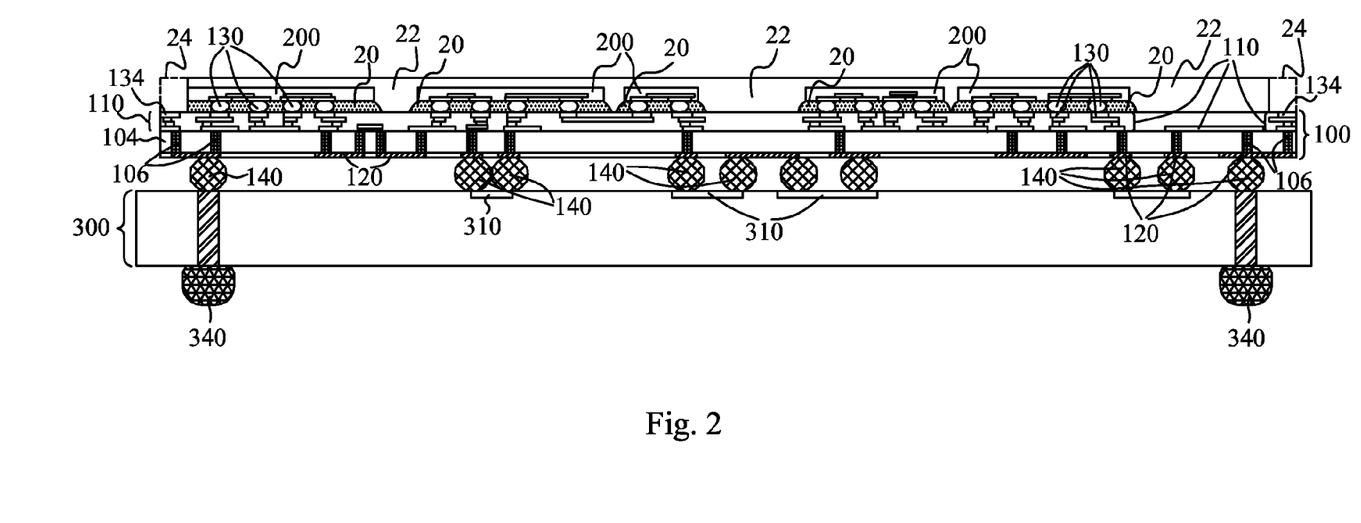

FIG. 2 illustrates the dispensing of underfill 20 and molding compound 22 onto package 10. Underfill 20 may be dispensed into the gaps between package components 200 and interposer 100 to protect electrical connectors 130. Molding compound 22 is formed on the front side of interposer 100, and covers package components 200. In an embodiment, after molding compound 22 is formed, probe pads 134 are still exposed, and hence the probing may be performed through probe pads 134 after the molding of molding compound 22. In alternative embodiments, probe pads 134 are covered by molding compound 22, and hence the probing needs to be performed before the formation of molding compound 22. Dashed lines 24 represent the position of molding compound 22 that covers probe pads 134.

FIG. 3 illustrates a magnified view of portion 141 (please refer to FIG. 1) of interposer 100, wherein probe pad 134, the connection to through-via(s) 106, and electrical connections 110 and 120 are shown in detail in FIG. 3. In an embodiment, probe pad 134 is in the form of under-bump-metallurgy (UBM), which includes a metal layer or a composite metal layer. Passivation layers 150 are formed over metal layers 152, which include metal lines 112 and vias 114. Metal layers 152 include bottom metal layer (M1) through top metal layer Mtop. Aluminum pad 154 connects metal lines 112 and vias 114 in metal layer 152 to probe pad 134. Furthermore, through-via 106 may electrically couple metal lines 112 and vias 114 in metal layer 152 to backside connections 120. Through such connections, probe pad 134 may be electrically coupled to a metal feature (such as electrical connectors 130 in FIG. 1) on the front side of interposer 100 through metal layers 152, and/or electrically coupled to a metal feature on the backside of interposer 100 through metal layers 152 and through-via 106.

By forming interposer 100 as shown in FIGS. 1 through 3, during the intermediate stages in the formation of package 10, probing may be performed through one or plurality of daisy chains formed in interposer 100, so that the reliability of electrical connectors 130 and 140, front-side connections 110, backside connections 120, and the like may be probed either from the front-side of the backside of interposer 100, and the connection problems may be identified. The probe schemes are illustrated in FIGS. 4 through 10. It is appreciated that one, some, or all of the connection schemes as shown in FIGS. 4 through 10 may be built in a same interposer 100.

Figure 4:
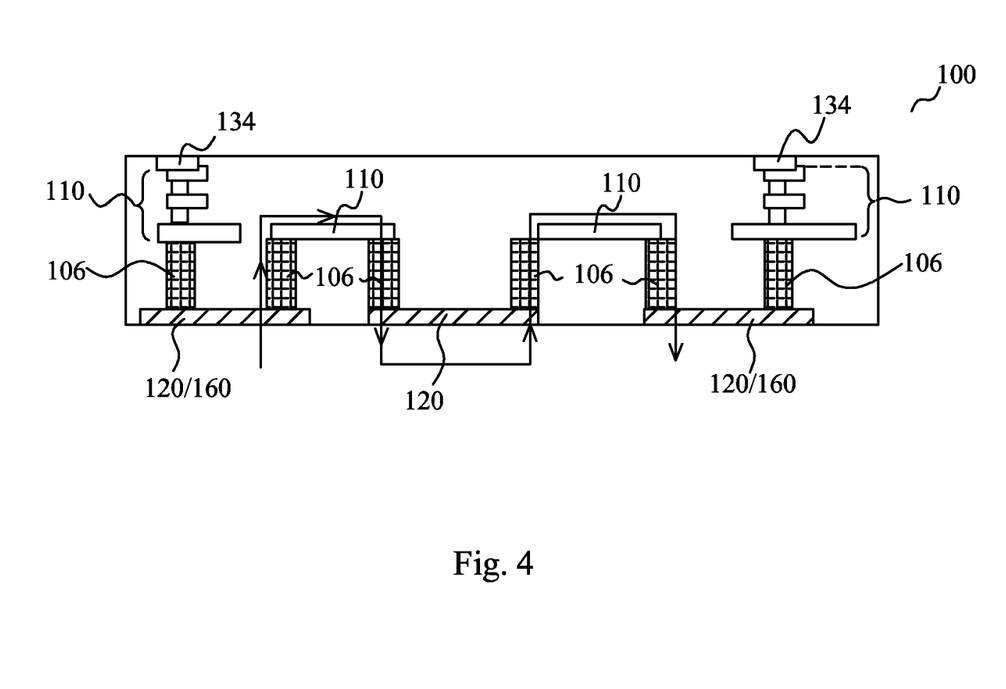
FIGS. 4 through 10 are cross-sectional views of the probing performed at various stages in the manufacturing of the package shown in FIGS. 1 and 2.

Referring to FIG. 4, after the formation of interposer 100, and before interposer 100 is bonded to package substrate 300 as in FIG. 1, probing may be performed through probe pads 134, for example, using a probe card (not shown). A daisy chain is formed between probe pads 134, wherein the path illustrated using arrows shows a portion of the daisy chain. The daisy chain includes a plurality of through-vias 106, front-side connections 110 and backside connections 120. Accordingly, by determining whether probe pads 134 are interconnected electrically or not, the connection status of through-vias 106, front-side connections 110, and backside connections 120 can be determined. Similarly, a daisy chain is formed between metal pads 160 on the backside of interposer 100, wherein metal pads 160 may be a part of backside connections 120. The daisy chain includes through-vias 106, front-side connections 110, and backside connections 120. By probing through metal pads 160, the connection status of through-vias 106, backside connections 120, and some front-side connections 110 may be found.

Figure 5:
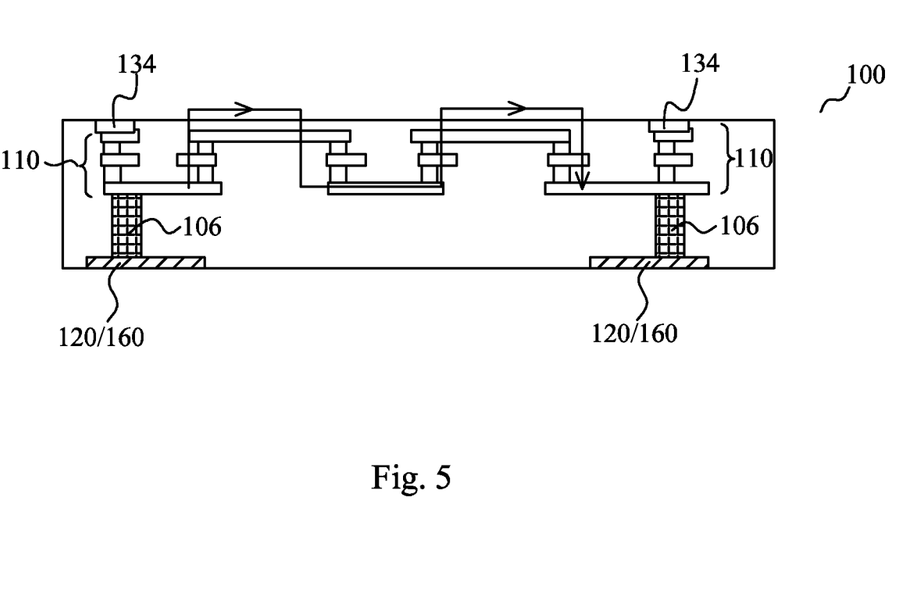

Referring to FIG. 5, after the formation of interposer 100, and before interposer 100 is bonded to package substrate 300 as in FIG. 1, probing may be performed through probe pads 134. A daisy chain is formed between probe pads 134. The daisy chain includes a plurality of front-side connections 110. Accordingly, by determining whether probe pads 134 are electrically interconnected or not, the connection status of front-side connections 110 can be determined. Similarly, a daisy chain is formed between metal pads 160 on the backside of interposer 100. The daisy chain includes through-vias 106, and front-side connections 110. By probing through backside metal pads 160, the connection status of through-vias 106 and front-side connections 110 may be found.

Figure 6:
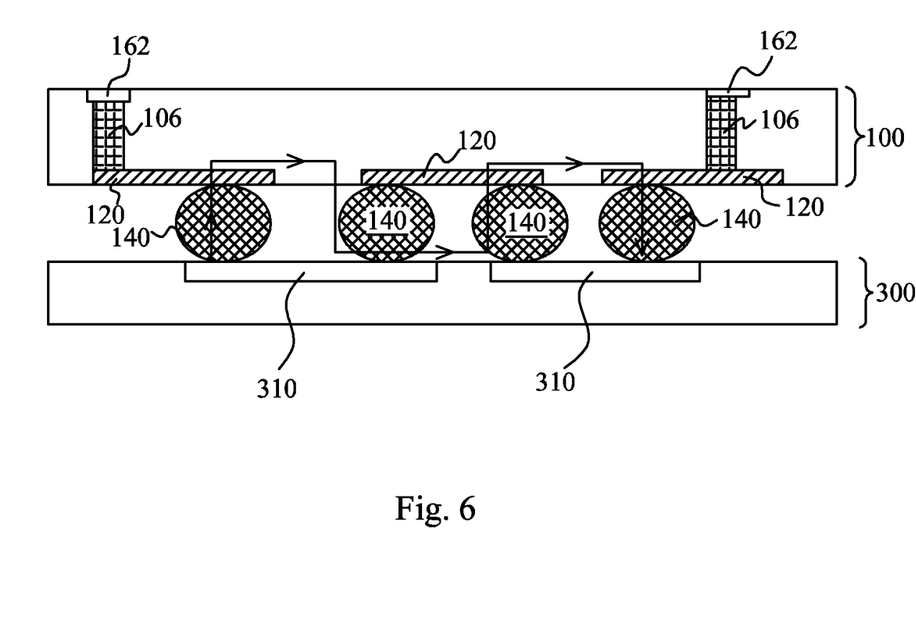

Referring to FIG. 6, before the formation of interposer 100 is finished, interposer 100 may be bonded to package substrate 300, and probing may be performed through metal pads 162, which may be in any of the metal layers 152 (FIG. 3), or may be aluminum pads 154. A daisy chain is connected between metal pads 162, and includes through-vias 106, electrical connectors 140, and connections 310 in package substrate 300. By determining whether metal pads 162 are electrically interconnected or not, the connection status of through-vias 106, electrical connectors 140, connections 310, and back-side metal 120 can be determined. In these embodiments, probe pads 134 as shown in FIG. 3 are also available, and are formed following the structure as shown in FIG. 6 is formed.

Figure 7:
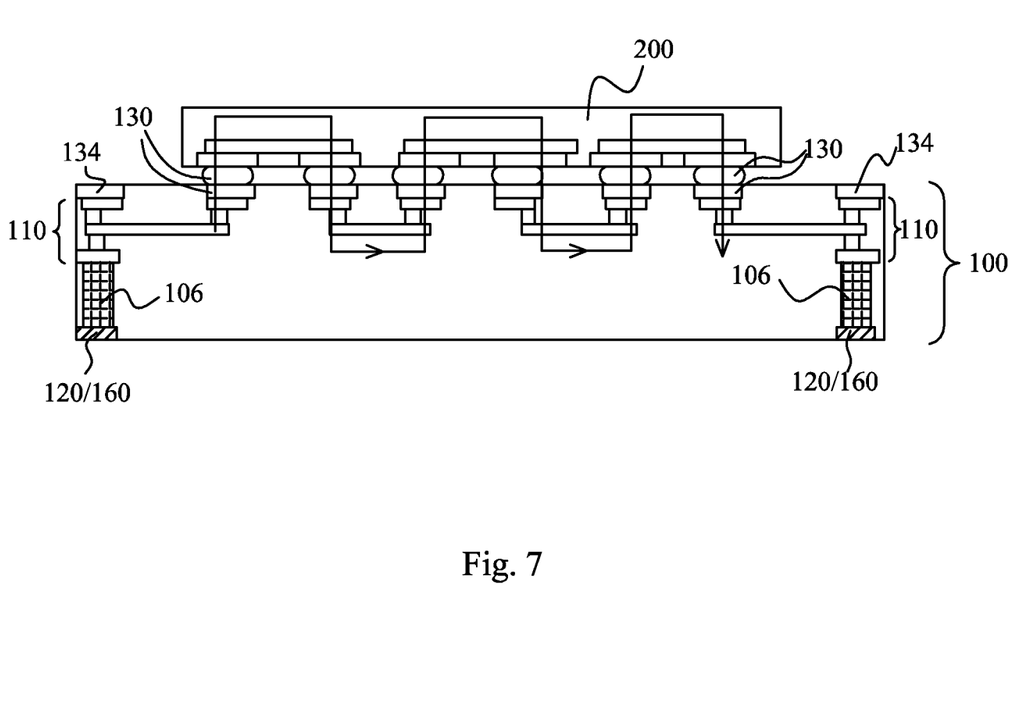

Referring to FIG. 7, after the formation of interposer 100, interposer 100 may be bonded to device die 200. Before bonding interposer 100 to package substrate 300 as in FIG. 1, probing may be performed through probe pads 134, wherein a daisy chain is formed between probe pads 134. The daisy chain includes electrical connectors 130, the connections in device die 200, and front-side connections 110. Accordingly, by determining whether probe pads 134 are electrically interconnected or not, the connection status of through-vias 106, front-side connections 110, and electrical connectors 130 can be determined. Similarly, a daisy chain is formed between metal pads 160 on the backside of interposer 100. The daisy chain includes through-vias 106, electrical connectors 130, the connections in package components 200, and front-side connections 110. By probing through backside metal pads 160, the connection status of these features may be found.

Figure 8:
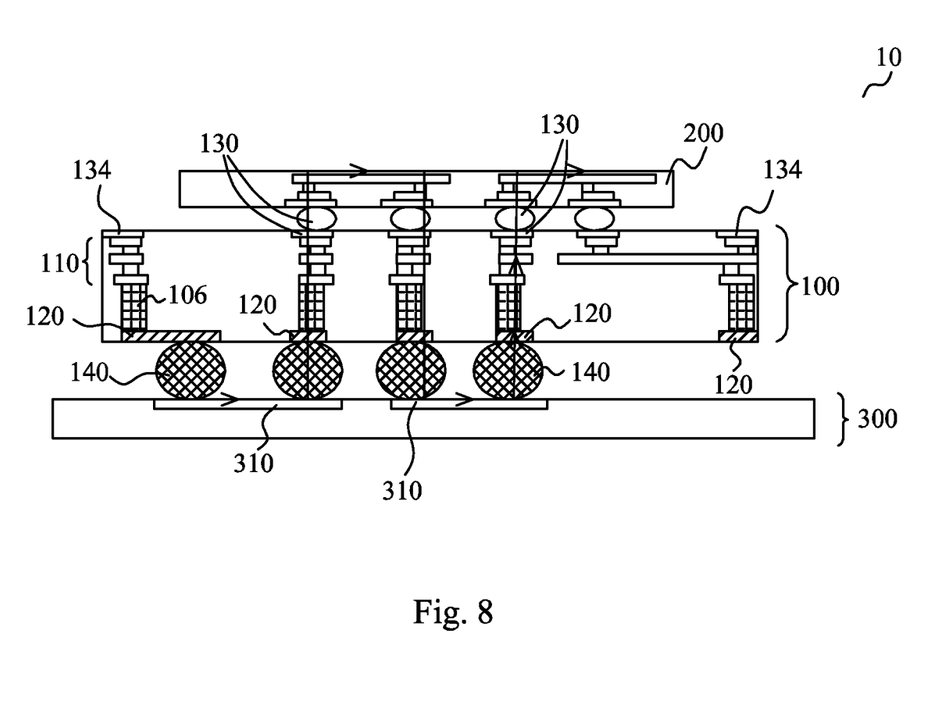

Referring to FIG. 8, after the bonding of interposer 100 to package component 200 and package substrate 300, probing may be performed through probe pads 134, wherein a daisy chain is formed between probe pads 134. The daisy chain may include a plurality of types of connections in package 10, which connections include electrical connectors 130, the connections in device die 200, front-side connections 110, backside connections 120, electrical connectors 140, connections 310, and the like. Accordingly, by determining whether probe pads 134 are electrically interconnected or not, the connection status of these features can be determined. Throughout the description, the probing that is performed after the formation of package 10 (which includes interposer 100, package components 200, and package substrate 300) is referred to as a full-loop probing, while the probing on portions, but not all, of package 10 is referred to a partial-loop probing.

Figure 9:
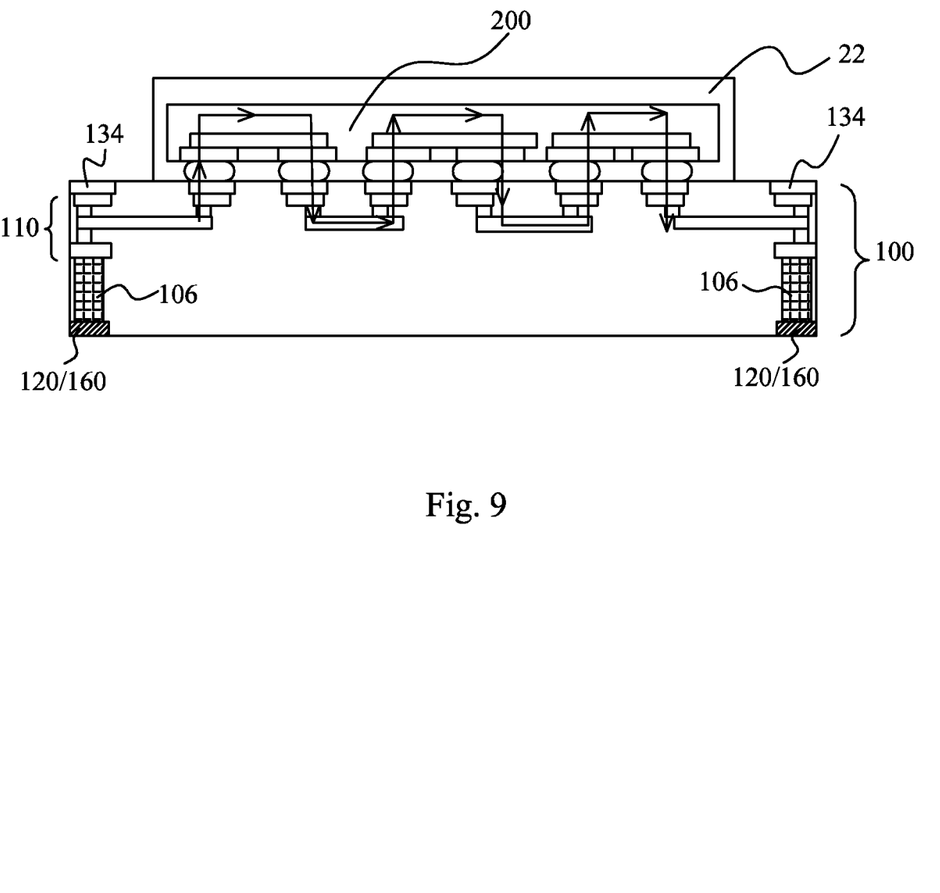

FIG. 9 illustrates the partial-loop probing of the interconnections in interposer 100 and/or package component 200 through probe pads 134 and/or metal pads 160. The probing scheme is essentially the same as shown in FIG. 7, except the probing may be performed after molding compound 22 is molded on package component 200 and interposer 100.

Figure 10:
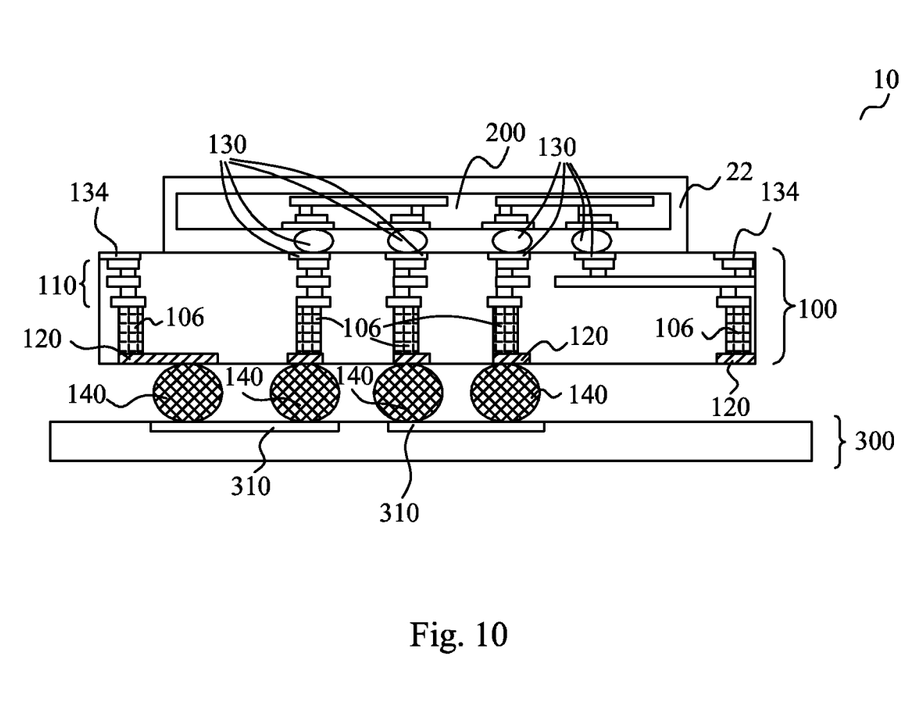

FIG. 10 illustrates the full-loop probing of the interconnections in package 10 through probe pads 134. The probing scheme is essentially the same as shown in FIG. 8, except the probing may be performed after molding compound 22 is molded on package component and interposer 100.

In the embodiments, by forming probe pads that are electrically coupled to electrical connectors, which are further for bonding interposer 100 to other package components, the probing may be performed during the intermediate stages in the formation of interposer 100 and the packaging of interposer 100. Therefore, without the need to wait for the packaging to finish, problems may be identified at an early stage, and the manufacturing throughput may be improved.

In accordance with embodiments, an interposer includes a first surface on a first side of the interposer and a second surface on a second side of the interposer, wherein the first and the second sides are opposite sides. A first probe pad is disposed at the first surface. An electrical connector is disposed at the first surface, wherein the electrical connector is configured to be used for bonding. A through-via is disposed in the interposer. Front-side connections are disposed on the first side of the interposer, wherein the front-side connections electrically couple the through-via to the probe pad.

In accordance with other embodiments, a device includes an interposer, which further includes a first surface on a first side of the interposer and a second surface on a second side of the interposer, wherein the first and the second sides are opposite sides. A first probe pad and a second probe pad are disposed at the first surface. A daisy chain electrically couples the first and the second probe pads with each other. A through-via is disposed in the interposer and electrically coupled to the first and the second probe pads.

In accordance with yet other embodiments, a method includes probing a first probe pad and a second probe pad to determine a connection status of a daisy chain that is electrically coupled between the first and the second probe pads, wherein the first and the second probe pads are on a first surface of an interposer. The interposer includes a through-via, and an electrical connector at the first surface of the interposer and electrically coupled to the through-via and the first and the second probe pads. The electrical connector is configured to bond the interposer to an additional package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   an interposer comprising:
      a first surface on a first side of the interposer and a second surface on a second side of the interposer, wherein the first and the second sides are opposite sides;
      a first probe pad at the first surface;
      an electrical connector at the first surface, wherein the electrical connector is configured to be used for bonding;
      a through-via in the interposer; and
      front-side connections on the first side of the interposer, wherein the front-side connections electrically couple the through-via to the probe pad.

2. The device of claim 1 further comprising:
   a second probe pad at the first surface; and
   a daisy chain electrically coupling the first probe pad to the second probe pad.

3. The device of claim 1 further comprising:
   a package substrate bonded to the second side of the interposer;
   additional electrical connectors bonding the package substrate to the interposer;
   a second probe pad at the first surface; and
   a daisy chain electrically coupling the first probe pad to the second probe pad, wherein the additional electrical connectors are in the daisy chain.

4. The device of claim 1 further comprising:
   two metal pads at the second surface of the interposer, wherein the two metal pads are electrically coupled to through-vias in the interposer; and
   an additional daisy chain electrically coupling the two metal pads with each other.

5. The device of claim 1 further comprising a device die bonded to the interposer through the electrical connector.

6. The device of claim 5 further comprising a molding compound molding the device die therein, wherein the first probe pad is not bonded to any package component on the first side of the interposer.

7. A device comprising:
   an interposer comprising:
      a first surface on a first side of the interposer and a second surface on a second side of the interposer, wherein the first and the second sides are opposite sides;
      a first probe pad and a second probe pad at the first surface; and
      a daisy chain electrically coupling the first and the second probe pads with each other, wherein the daisy chain comprises:
         metal lines on the first and the second sides of the interposer;
         a first through-via electrically coupled to the first and the second probe pads; and
         a second though-via.

8. The device of claim 7 further comprising:
   a package substrate bonded to the second side of the interposer; and
   an electrical connector bonding the package substrate to the interposer, wherein the electrical connector is in the daisy chain.

9. The device of claim 7, wherein the daisy chain comprises:
   metal features in a package substrate bonded to the second side of the interposer; and
   an electrical connector connecting the interposer to the package substrate.

10. The device of claim 7, wherein the daisy chain comprises:
    additional metal lines and vias on a same side of the first through-via as the first and the second probe pads;
    a device die bonded to the first side of the interposer; and
    an electrical connector connecting the interposer to the device die.

11. The device of claim 7, wherein the daisy chain comprises:
    a device die bonded to the first side of the interposer;
    a first electrical connector connecting the interposer to the device die; and
    a package substrate bonded to the second side of the interposer.

12. The device of claim 7 further comprising:
a device die bonded to the interposer; and
an electrical connector bonding the device die to the interposer, wherein the daisy chain is electrically coupled to the electrical connector.

13. The device of claim 12 further comprising a molding compound molding the device die therein, wherein the molding compound does not mold the first and the second probe pads therein.

14. A method comprising:
probing a first probe pad and a second probe pad to determine a connection status of a daisy chain electrically coupled between the first and the second probe pads, wherein the first and the second probe pads are on a first surface of an interposer, and wherein the interposer comprises:
a through-via; and
an electrical connector at the first surface of the interposer and electrically coupled to the through-via and the first and the second probe pads, wherein the electrical connector is configured to bond the interposer to an additional package component.

15. The method of claim 14, wherein the daisy chain comprises a feature selected from the group consisting essentially of:
metal lines on opposite side of the through-via,
a device die bonded to the first surface of the interposer,
a first electrical connector bonding and electrically coupling the interposer to the device die,
a package substrate bonded to a second surface of the interposer, wherein the first and the second surfaces are opposite surfaces of the interposer,
the through-via, and combinations thereof.

16. The method of claim 14 further comprising bonding the interposer to the additional package component, wherein the step of probing is performed after the step of bonding.

17. The method of claim 16 further comprising applying a molding compound on the additional package component, wherein the step of probing is performed after the step of applying the molding compound.

18. The method of claim 17, wherein the molding compound does not cover the first the second probe pads.

* * * * *